(12) United States Patent
Shankar et al.

(10) Patent No.: US 9,013,012 B2
(45) Date of Patent: Apr. 21, 2015

(54) SELF-SEALING MEMBRANE FOR MEMS DEVICES

(71) Applicant: STMicroelectronics Pte Ltd., Singapore (SG)

(72) Inventors: Ravi Shankar, Singapore (SG); Olivier Le Neel, Singapore (SG); Shian Yeu Kam, Singapore (SG); Tien Choy Loh, Singapore (SG)

(73) Assignee: STMicroelectronics Pte. Ltd., Singapore (SG)

( * ) Notice: Subject to any disclaimer, the term of this patent is extended or adjusted under 35 U.S.C. 154(b) by 0 days.

(21) Appl. No.: 13/785,938

(22) Filed: Mar. 5, 2013

(65) Prior Publication Data

US 2014/0252507 A1     Sep. 11, 2014

(51) Int. Cl.
   *H01L 29/84*    (2006.01)
   *B81C 1/00*     (2006.01)
   *B81B 7/00*     (2006.01)

(52) U.S. Cl.
   CPC ........... *B81C 1/00293* (2013.01); *B81B 7/0041* (2013.01)

(58) Field of Classification Search
   CPC .................................................. H01H 59/0009
   USPC ............................................. 257/415; 438/50
   See application file for complete search history.

(56) References Cited

U.S. PATENT DOCUMENTS

| | | | | |
|---|---|---|---|---|
| 6,012,336 A * | 1/2000 | Eaton et al. | ...................... | 73/754 |
| 6,478,974 B1 * | 11/2002 | Lebouitz et al. | .................. | 216/2 |
| 7,148,077 B2 * | 12/2006 | Fuertsch et al. | ................ | 438/53 |
| 7,579,663 B2 * | 8/2009 | Wan | .............................. | 257/415 |
| 7,923,790 B1 * | 4/2011 | Quevy et al. | .................. | 257/415 |
| 2008/0277755 A1 * | 11/2008 | Freywald | ....................... | 257/506 |
| 2010/0200938 A1 * | 8/2010 | Wang | ............................ | 257/414 |
| 2011/0031567 A1 | 2/2011 | Corona et al. | | |
| 2011/0053321 A1 * | 3/2011 | Huang | .......................... | 438/127 |
| 2011/0316101 A1 * | 12/2011 | Dang et al. | .................... | 257/418 |
| 2012/0237061 A1 | 9/2012 | Corona et al. | | |
| 2012/0274647 A1 * | 11/2012 | Lan et al. | ...................... | 345/531 |

* cited by examiner

*Primary Examiner* — Jarrett Stark
*Assistant Examiner* — Mohammad M Hoque
(74) *Attorney, Agent, or Firm* — Seed IP Law Group PLLC

(57) ABSTRACT

Embodiments of the present disclosure are related to MEMS devices having a suspended membrane that are secured to and spaced apart from a substrate with a sealed cavity therebetween. The membrane includes openings with sidewalls that are closed by a dielectric material. In various embodiments, the cavity between the membrane and the substrate is formed by removing a sacrificial layer through the openings. In one or more embodiments, the openings in the membrane are closed by depositing the dielectric material on the sidewalls of the openings and the upper surface of the membrane.

13 Claims, 4 Drawing Sheets

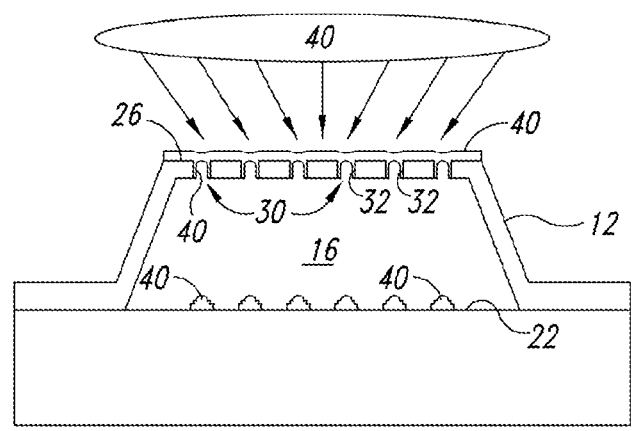
*FIG. 3F*
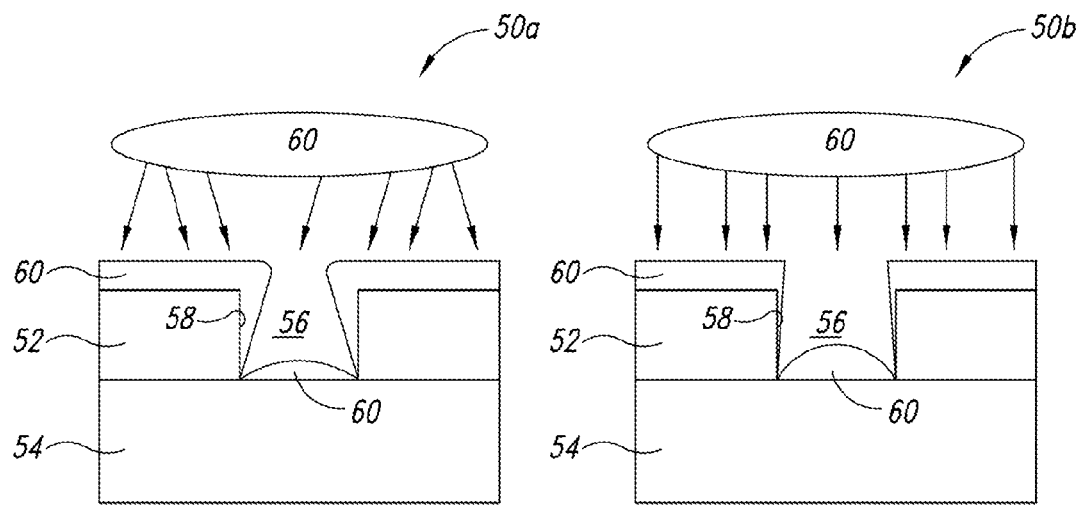
*FIG. 4A*        *FIG. 4B*

SELF-SEALING MEMBRANE FOR MEMS DEVICES

BACKGROUND

1. Technical Field

Embodiments of the present disclosure relate to microelectromechanical (MEMS) devices, and in particular, MEMS devices having suspended membranes.

2. Description of the Related Art

Membrane MEMS devices, such as pressure sensors and microphones, are used in various applications. Typically, membrane MEMS devices, such as the device 10 shown in FIG. 1, includes a structural layer 12 having a portion that is supported by a substrate 14 and a portion forming a suspended membrane 13 that is separated from the substrate 14 by a cavity 16.

In some cases, membrane MEMS devices are fabricated using surface micromachining to release or suspend the membrane. Generally described, surface micromachining includes forming a sacrificial layer on a surface of a substrate. A structural layer is then formed on the sacrificial layer. Openings are formed in the structural layer, and the sacrificial layer is removed through the openings thereby releasing the membrane and forming a cavity.

For various applications, the cavity is sealed from atmosphere and set at a particular pressure. In that regard, the openings used to remove the sacrificial layer will be closed, sealing the cavity.

In the past, the openings have been closed by an indirect sealing, such as is shown in the device 10 of FIG. 1. In particular, a cover 18 is provided over the structural layer 12 so that the space within the cover 18, including the cavity 16, is sealed from atmosphere. The cover 18 may be secured to the substrate 14, such as by anodic bonding.

BRIEF SUMMARY

Embodiments of the present disclosure are related to MEMS devices having a suspended membrane that are secured to and spaced apart from a substrate with a sealed cavity therebetween. The membrane includes openings with sidewalls that are closed by a dielectric material. In various embodiments, the cavity between the membrane and the substrate is formed by removing a sacrificial layer through the openings. In one or more embodiments, the openings in the membrane are closed by depositing the dielectric material on the sidewalls of the openings and the upper surface of the membrane.

In one embodiment, there is provided a method of forming a membrane MEMS device. The method includes forming a sacrificial layer over a surface of a substrate and forming a structural layer over the sacrificial layer. The method further includes forming a plurality of openings with sidewalls in the structural layer. The method further includes releasing a portion of the structural layer by removing the sacrificial layer through the plurality of openings in the structural layer. The method further includes closing the openings by depositing a dielectric material on the sidewalls of the openings.

BRIEF DESCRIPTION OF THE SEVERAL VIEWS OF THE DRAWINGS

FIGS. 3A-3F are partial schematic side views of various stages for forming the membrane MEMS device of FIG. 2.

FIGS. 4A and 4B are partial schematic side views of the effects of arrival angle during PECVD deposition.

DETAILED DESCRIPTION

Figure 1:
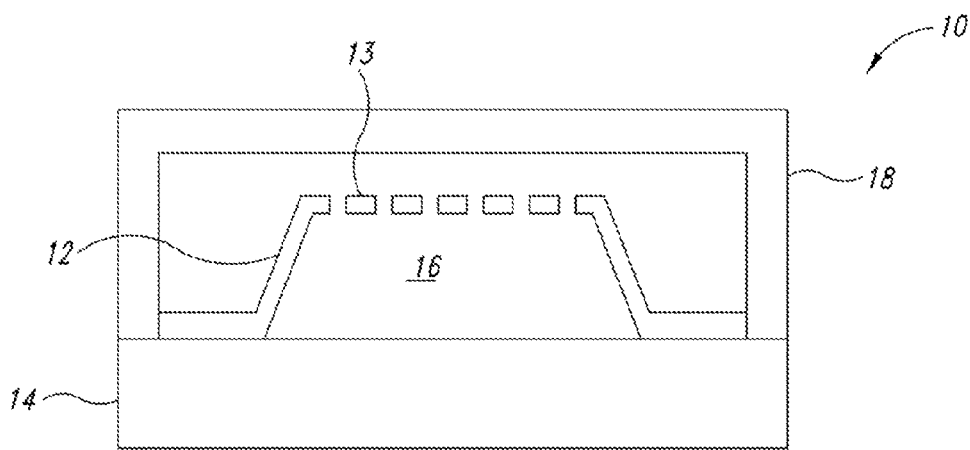
FIG. 1 is a partial schematic side view of a membrane MEMS device.
Figure 2A:
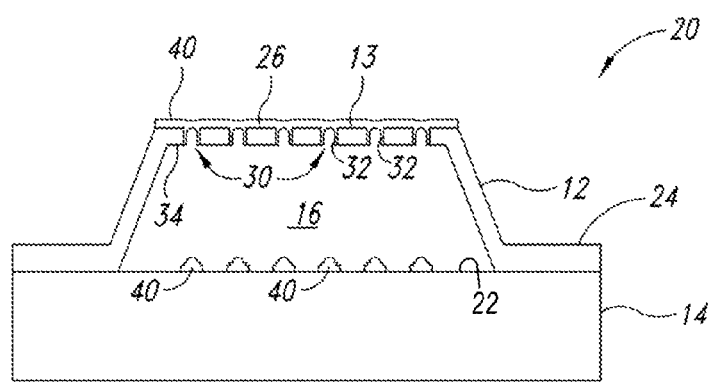
FIG. 2A is a partial schematic side view of a membrane MEMS device according to an embodiment of the present disclosure.

FIG. 2A is a partial schematic side view of a membrane MEMS device 20 that has been formed according to an embodiment of the present disclosure. Generally described, the membrane MEMS device 20 includes a structural layer 12 that includes a suspended membrane 13 that is spaced apart from an upper surface 22 of a substrate 14 by a cavity 16. A leg portion 24 of the structural layer 12 located outwardly of the suspended membrane 13 is secured to the substrate 14. In one embodiment, the substrate 14 is a semiconductor material, such as monocrystalline silicon.

The substrate 14 may have one or more layers formed in and/or on the upper surface 22. For instance, in one embodiment the membrane MEMS device 20 is a capacitive pressure sensor. In that regard, the substrate 14 may have a conductive layer formed on the upper surface 22 of the substrate 14 in the cavity 16 such that the conductive layer is spaced apart from the suspended membrane 13. The conductive layer on the substrate 14 is a fixed electrode and the suspended membrane 13 is the moveable electrode of the capacitor. In other embodiments, the substrate itself is formed to act as the fixed electrode for the capacitor. In another embodiment, the substrate 14 has logic circuits and transistors formed therein. They might be below the upper surface 22 or off to one side.

Depending on the application, the cavity 16 of the device 20 is set at a particular pressure and sealed from atmosphere. In the embodiment in which the device 20 is a pressure sensor, the membrane 13 is made from any suitable material and has a suitable thickness that allows the membrane 13 to move in response to pressure being applied to its upper surface 26. In some embodiments, the membrane material is electrically conductive, such as a metal material. In another embodiment, the membrane material is a semiconductor material, such as single crystal silicon or polysilicon. In yet another embodiment, the membrane 13 is made of a plurality of layers of various materials. In one embodiment, the membrane is aluminum and has a thickness of less than 1 micron.

The membrane 13 includes openings 30 having sidewalls 32 that extend from the upper surface 26 of the membrane 13 to a lower surface 34 of the membrane 13. A dielectric material 40 is located on the upper surface 26 of the membrane 13 and along the sidewalls 32 of the openings 30 to at least partially fill the openings 30 so as to seal the cavity 16. The dielectric material 40 may be any material configured to adhere to the sidewalls 32 of the openings 30. In one embodiment, the dielectric material 40 is silicon nitride.

In the illustrated embodiment, some of the dielectric material 40 is also located on the upper surface 22 of the substrate 14 as will be explained in more detail below. It is to be appreciated that dielectric material 40 on the upper surface 22 of the substrate 14 does not substantially affect the operation of the membrane MEMS device 20. In other embodiments, the membrane MEMS device 20 may also include dielectric material 40 on the portion 24 of the structural layer 12 or on the entire outer surface of the structural layer 12.

Figure 2B:
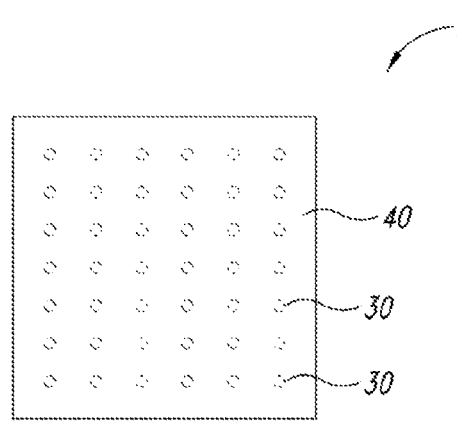
FIG. 2B is a partial plan view of the membrane MEMS device of FIG. 2A.

In FIG. 2B, which is a plan view of the membrane 13 of the membrane MEMS device 20 of FIG. 2A, the openings 30 are shown in dotted line to indicate that they are located beneath the dielectric material 40. The openings 30 are formed in the portion of the structural layer 12 that forms the suspended membrane 13 and are generally not formed in the portion 24 of the structural layer 12 that is used to secure the structural layer 12 to the substrate 14. Although the illustrated embodiment shows an array of openings 30, the openings 30 may be arranged in a different pattern.

As will be explained below, the openings 30 are used to remove a sacrificial layer and suspend the membrane 13. Although the openings are illustrated in a circular shape, the openings 30 may be of any shape suitable to suitably allow removal of the sacrificial layer 42.

Figure 3A:
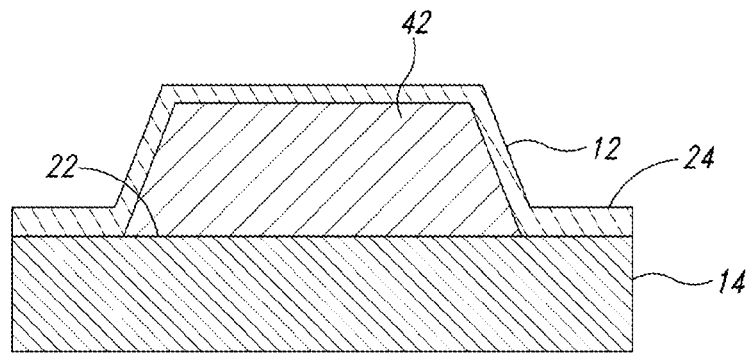

FIGS. 3A-3F are partial schematic side views of various stages for forming the membrane MEMS device 20 according to one embodiment. As shown in FIG. 3A, a sacrificial layer 42 is formed over the upper surface 22 of the substrate 14 as is well known in the art. The sacrificial layer 42 is an insulating material, such as oxide, polyimide, or a combination thereof. The structural layer 12 is formed over the sacrificial layer 42 and is secured to the substrate 14 at portion 24.

Figure 3B:
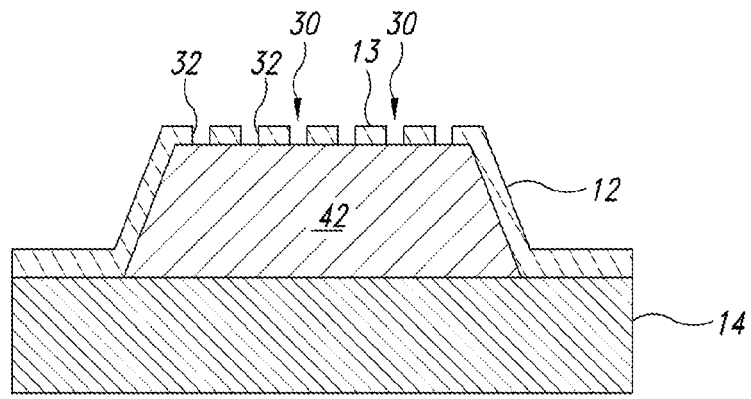

As shown in FIG. 3B, openings 30 are formed in the portion of the structural layer 12 that forms the suspended membrane 13. As discussed above, the openings 30 have sidewalls 32 that extend through the entire thickness of the structural layer 12 thereby exposing the sacrificial layer. As is well known in the art, the openings 30 may be formed by forming a patterned mask layer over the structural layer 12 and etching the structural layer 12 to form the openings 30. In another embodiment, the structural layer 12 may be formed over the sacrificial layer 42 with the openings 30.

Figure 3C:
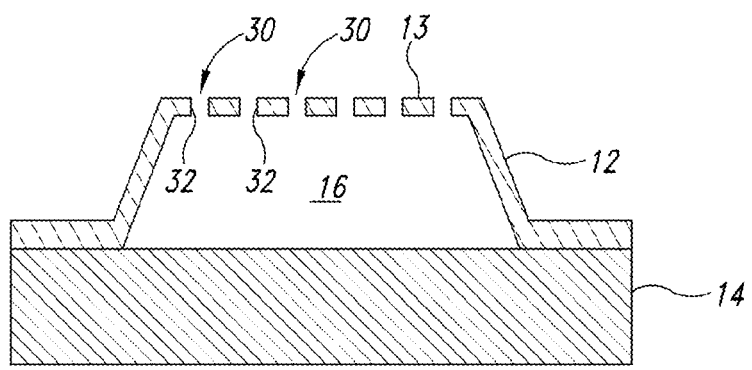

As shown in FIG. 3C, the sacrificial layer is removed through the openings 30 in the structural layer 12, suspending the membrane 13 and forming the cavity 16 between the suspended membrane 13 and the substrate 14. In particular, the openings 30 may be removed by etching the sacrificial layer 42 through the openings 30. As is well known in the art, the sacrificial layer 42 may be removed by a wet etch process, such as by hydrofluoric acid.

In another embodiment, the sacrificial layer 42 may be removed by a dry etch process. In such an embodiment, the sacrificial layer 42 may be, for example, polyimide. By using a dry etch process to remove the sacrificial layer 42, various benefits may be obtained. One such benefit is that the openings 30 formed in the membrane 13 may have smaller dimensions than when a wet etch process is used. That is, in a wet etch process the dimensions of the openings need to be sufficiently large to allow the fluid to flow there-through. By forming smaller openings, the openings will be easier to close as will be discussed in more detail below. Furthermore, using a dry etch process rather than a wet etch process also resolves problems associated with agents from the wet etch process remaining trapped in the cavity. These agents can cause a risk of impairing the functionality of the membrane. For instance, capillary action caused by the trapped liquid can be sufficient to force the membrane 13 toward the substrate 14, and in some cases cause the membrane 13 to collapse.

Figure 3D:
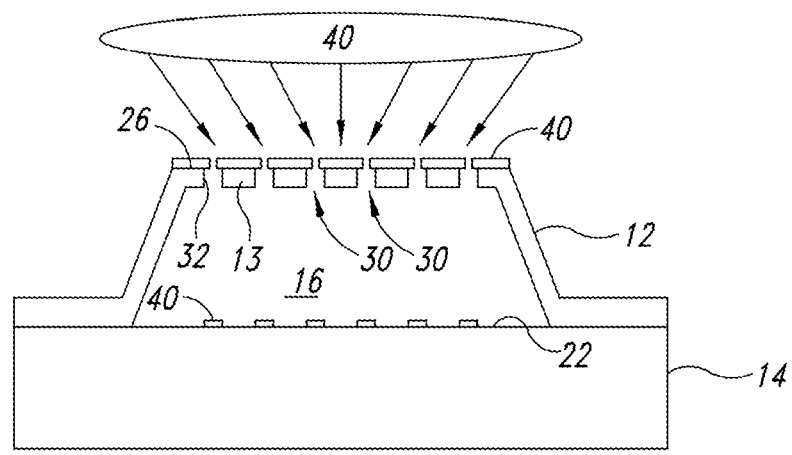
Figure 3E:
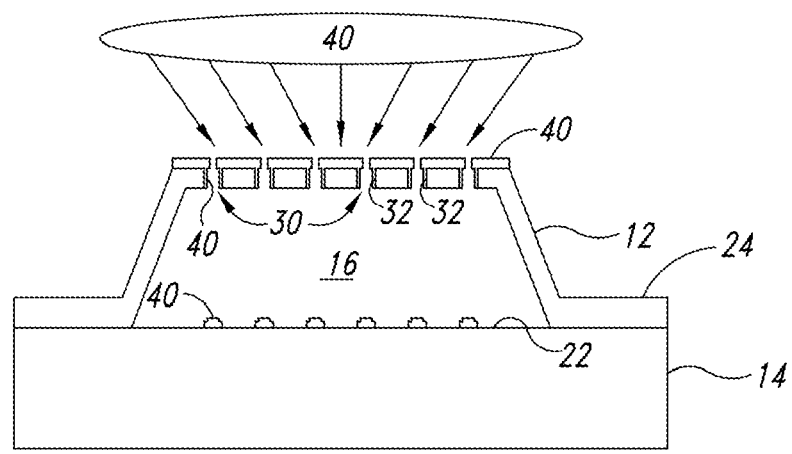

After the sacrificial layer 42 has been suitably removed to suspend the membrane 13, the openings 30 are closed to seal the cavity 16. In particular, the openings 30 may be closed by depositing the dielectric material 40 along the sidewalls 32 of the openings 30 and on the upper surface 26 of the suspended membrane 13. The dielectric material 40 is deposited by plasma enhanced chemical vapor deposition (PECVD). As shown in FIGS. 3D-3F, a substantial portion of the dielectric material 40 is deposited using a wide angle of incidence (or arrival angle) so that the dielectric material is directed toward and builds up on the sidewalls of the openings. The angle of incidence at which the dielectric material is directed toward the membrane 13 may be any width suitable to close the openings 30 and seal the cavity 16. In one embodiment, the angle of incidence is between about 30° and 60°, with 40° being preferred.

FIGS. 4A and 4B show a close up view of first and second structures 50a and 50b, respectively, and show the difference that the angles of incidence may have during a deposition process. Each of the first and second structures 50a and 50b includes a material 52 formed on a substrate 54, with the material 52 having an opening 56 and forming sidewalls 58. In FIG. 4A, a dielectric 60 is deposited using a wide angle of incidence, and in FIG. 4B, a dielectric 60 is deposited using a substantially narrow angle of incidence that is nearly vertical. As can be seen in FIG. 4A, when the angle of incidence is wide, the dielectric 60 is directed toward and deposits onto the sidewalls 58 of the openings 56. Conversely, as shown in FIG. 4B, when the angle of incidence is narrow and more vertical, the dielectric 60 is not directed toward the sidewalls 58 of the opening 56 and thus does not build along the sidewalls 58. As shown in FIGS. 4A and 4B, a portion of the dielectric 60 is deposited on the substrate 54, however, in FIG. 4A a smaller portion is deposited on the substrate 54 than in FIG. 4B.

The angle of incidence for deposition can be achieved by a number of techniques. In one embodiment, the angle is set at one desired value, such as 40° from the vertical on one side, and the deposition carried out for a selected time, such as 5 minutes. Then, the angle is changed to 40° from the vertical to the other side and deposition continues for the same selected amount of time. The deposited layer 60 slowly builds up as shown.

In an alternative embodiment, the angle varies continuously from +40° to −40° from the vertical for the entire deposition period.

FIGS. 3D-3F show various stages of the membrane MEMS device 20 during the PECVD process to close the openings 30. It is to be appreciated that these stages are not distinct stages of the process but rather are provided herein for illustrative purposes to show how the openings of the membrane are closed. As shown in FIG. 3D, the dielectric material 40 is directed toward the upper surface 26 of the membrane 13 with a wide angle of incidence. The dielectric material 40 adheres to the upper surface 26 of the membrane 13 and has a cantilever portion that extends beyond the openings 30 thereby making the openings 30 smaller. Some dielectric material 40 goes through the openings 30 and deposits on the upper surface 22 of the substrate 14.

As shown in FIG. 3E, which is some time later, and in many cases seconds later, the dielectric material 40 continues to be directed toward the membrane 13 with a wide angle of incidence and is beginning to adhere to the sidewalls 32 of the openings 30. The dielectric material 40 continues to have a cantilever portion that extends beyond the openings 30 making the openings smaller than shown in FIG. 3C. Some of the dielectric material 40 continues to be deposited on the upper surface 22 of the substrate 14.

As shown in FIG. 3F, which may be seconds later, the dielectric material 40 continues to be directed toward the membrane 13 with a wide angle of incidence. More dielectric material 40 adheres to the sidewalls 32 of the openings 30 and to the upper surface 26 of the membrane 13 such that the openings 30 are closed, thereby sealing the cavity 16. The thickness of dielectric material 40 is any thickness suitable to seal the openings 30. In one embodiment, the thickness is 1.5 microns.

Again, some dielectric material 40 continues to be deposited on the upper surface 26 of the substrate 14. As can be seen from FIGS. 3D-3F, the width of the dielectric material 40 in the cavity 16 becomes smaller over time. This is due to the fact that the widths of the openings 30 become smaller over time due to the cantilever of dielectric material 40 extending into the openings 30.

It is to be appreciated that various dimensions of the membrane MEMS device may be adjusted to accommodate the dielectric deposition process. For instance, the height of the cavity may be an amount such that the dielectric deposited on the upper surface of the substrate does not prevent the membrane from functioning for its intended purpose. For instance, in the embodiment in which the membrane functions as a pressure sensor, the height of the cavity should be of an amount that the when the membrane flexes inwardly toward the substrate due to a pressure applied to the upper surface of the membrane, the lower surface of the membrane does not come in contact with the dielectric material that was deposited on the upper surface of the substrate.

The membrane dimensions may also be adjusted to accommodate the deposition process. For instance, the higher the aspect ratio of the opening, i.e., the width of the opening versus the thickness of the membrane, the width the deposition angle of incidence must be. In that regard, in many embodiments the aspect ratio of the openings is small. In one embodiment, the aspect ratio is less than or equal to 1. That is, the thickness of the membrane is equal to or greater than the diameter (or at least one dimension when not a circle) of the opening. In one embodiment, the openings have a diameter that is less than 1 micron, and the membrane thickness is equal to 1 micron. Similarly the spacing between the openings will typically depend on the size of the openings. That is, as the size of the opening goes up, the number of openings can go down. In one embodiment, the spacing between the openings is 1.5 times the diameter of each opening. It is also to be appreciated that the thickness of the dielectric deposited will also depend on the size of the openings.

One benefit of sealing the cavity of the membrane MEMS device using a PECVD process is that in some embodiments, the pressure of the cavity may be set while in the PECVD chamber. That is, the chamber in which the deposition takes place may be pressurized at the same level in which the cavity is to be set. It is to be appreciated that various pressure levels may be used, but as one example, the cavity of a pressure sensor membrane MEMS device preferably has a pressure of 3 to 4 Torr. In such a case, the chamber of the PECVD tool may pressurized to between about 3 to 4 Torr during the deposition step.

In addition to the pressure setting advantage, various other benefits may be obtained by the present invention. One benefit discussed above includes the ability to use a dry etch process to remove the sacrificial layer and suspend the membrane. Using a dry etch process can prevent various failures of the device, such as collapse of the membrane. By using a dry etch process, the dimensions of the openings may be reduced. Thus, by being able to limit the size of the openings, the ability to close the openings by depositing the dielectric material along the sidewalls of the openings has increased. Furthermore, it should be appreciated that the methods described herein can be applied at a wafer level and can be readily integrated into a current processing line.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of forming a flexible membrane, comprising:
    forming a sacrificial layer over a surface of a substrate;
    forming a conductive electrode over the sacrificial layer, the conductive electrode including a plurality of openings with sidewalls;
    forming a cavity between the conductive electrode and the substrate by removing the sacrificial layer through the plurality of openings in the conductive electrode; and
    closing the openings by depositing a dielectric material on the sidewalls of the openings and on an upper surface of the portion of the conductive electrode, and continuing to deposit the dielectric material for a time period after the openings are closed to seal the cavity from atmosphere, wherein depositing the dielectric material includes alternatingly directing the dielectric material between a first angle of incidence and a second angle of incidence, the second angle of incidence being different from the first angle of incidence, the deposited dielectric material and the conductive electrode together forming the flexible membrane.

2. The method of claim 1 wherein the first angle of incidence is between about positive 30° and 60° and the second angle of incidence is between about negative 30° and 60°.

3. The method of claim 1 wherein depositing the dielectric material comprises depositing the dielectric material by chemical vapor deposition.

4. The method of claim 1 wherein depositing the dielectric material further includes depositing dielectric material on the outer surface of the released conductive electrode.

5. The method of claim 1 wherein depositing the dielectric material further includes providing portions of the dielectric material through the plurality of openings and depositing the portions of the dielectric material on the surface of the substrate below the released portion of the structural layer.

6. The method of claim 1 wherein forming the plurality of openings in the structural layer having a width or a diameter equal to or less than a thickness of the conductive electrode.

7. The method of claim 1 wherein the dielectric material has a thickness that is 1.5 times greater than a thickness of the structural layer.

8. A method of forming a flexible membrane, the method comprising:
    forming a conductive electrode over a surface of a substrate, the conductive electrode being spaced apart from the surface of the substrate and defining a cavity therebetween, the conductive electrode having a plurality of openings with sidewalls; and
    depositing a dielectric material on the sidewalls of each opening and an outer surface of the conductive electrode to a sufficient depth to seal the cavity thereby forming the flexible membrane, wherein depositing the dielectric material includes alternatingly directing the dielectric material between a first angle of incidence and a second angle of incidence, the second angle of incidence being different from the first angle of incidence.

9. The method of claim 8 wherein the pressure in the cavity is lower than atmosphere.

10. The method of claim 8 wherein forming the conductive electrode over the surface of the substrate comprises removing a sacrificial layer through the plurality openings to define the cavity.

11. The method of claim 8 wherein each opening has a width or diameter that is equal to or less than a thickness of the conductive electrode.

12. The method of claim 8 wherein the cavity has a depth that is at least 5 times greater than a thickness of the conductive electrode.

13. The method of claim 8 wherein the first angle of incident is positive and the second angle of incident is negative.

* * * * *